(12) United States Patent
Thalhammer et al.

(10) Patent No.: US 8,091,190 B2
(45) Date of Patent: Jan. 10, 2012

(54) METHOD OF MANUFACTURING AN ACOUSTIC MIRROR FOR A PIEZOELECTRIC RESONATOR

(75) Inventors: Robert Thalhammer, Munich (DE); Stephan Marksteiner, Neubiberg (DE); Gernot Fattinger, Munich (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 61 days.

(21) Appl. No.: 12/711,484

(22) Filed: Feb. 24, 2010

(65) Prior Publication Data

US 2010/0146755 A1 Jun. 17, 2010

Related U.S. Application Data

(62) Division of application No. 11/361,840, filed on Feb. 24, 2006, now Pat. No. 7,694,397.

(51) Int. Cl.
*H01L 41/22* (2006.01)
*H01L 41/00* (2006.01)
*H03L 9/00* (2006.01)

(52) U.S. Cl. ............... 29/25.35; 29/25.41; 29/25.42; 29/832; 29/593; 29/594; 310/355; 310/328; 333/187

(58) Field of Classification Search ............ 29/25.35, 29/25.41, 25.42, 832, 831, 593, 594; 310/355, 310/358, 328, 320, 324, 193; 333/187, 189, 133, 144
See application file for complete search history.

(56) References Cited

U.S. PATENT DOCUMENTS

| 5,604,149 | A  | * | 2/1997  | Paoli et al. ............... 438/437 |
| 5,821,833 | A  |   | 10/1998 | Lakin |
| 5,853,601 | A  | * | 12/1998 | Krishaswamy et al. ........ 216/2 |
| 5,910,756 | A  |   | 6/1999  | Ella |
| 6,081,171 | A  |   | 6/2000  | Ella |
| 6,420,272 | B1 |   | 7/2002  | Shen et al. |
| 6,534,900 | B2 |   | 3/2003  | Aigner et al. |
| 6,542,054 | B2 |   | 4/2003  | Aigner et al. |
| 6,998,940 | B2 |   | 2/2006  | Metzger |
| 7,491,569 | B2 |   | 2/2009  | Fattinger et al. |
| 2002/0154425 | A1 | | 10/2002 | Aigner et al. |
| 2007/0209174 | A1 | | 9/2007  | Aigner |

* cited by examiner

*Primary Examiner* — Derris Banks
*Assistant Examiner* — Tai Nguyen

(57) ABSTRACT

A mirror for a piezoelectric resonator consisting of alternately arranged layers of high and low acoustic impedance is manufactured by at first producing a first layer on which a second layer is produced, so that the second layer partially covers the first layer. Then, a planarization layer is applied on the first layer and on the second layer. Subsequently, a portion of the second layer is exposed by structuring the planarization layer, wherein the portion is associated with an active region of the piezoelectric resonator. Finally, the resulting structure is planarized by removing the portions of the planarization layer remaining outside the portion.

8 Claims, 7 Drawing Sheets

METHOD OF MANUFACTURING AN ACOUSTIC MIRROR FOR A PIEZOELECTRIC RESONATOR

This application is a divisional patent application under 37 C.F.R. §1.53(b) of commonly owned U.S. patent application Ser. No. 11/361,840 to Robert Thaihammer, et al. and filed on Feb. 24, 2006. Priority to U.S. patent application Ser. No. 11/361,840 is hereby claimed under 35 U.S.C. §121. The entire disclosure of U.S. patent application Ser. No. 11/361,840 is specifically incorporated herein by reference.

BACKGROUND OF THE INVENTION

1. Field of the Invention

The present invention relates to the field of piezoelectric resonators, e.g. BAW (bulk acoustic wave) resonators, and particularly to a method of manufacturing an acoustic mirror for a piezoelectric resonator, as well as to a method of manufacturing a piezoelectric resonator. In particular, the present invention relates to a method of manufacturing an acoustic mirror, which is highly planar and has both excellent uniformity in the layer deposition and a planar surface of the entire mirror structure.

2. Description of the Related Art

Radio-frequency filters based on BAW resonators are of great interest for many RF applications. Substantially, there are two concepts for BAW resonators, so-called thin film BAW resonators (FBAR), on the one hand, as well as so-called solidly mounted resonators (SMR). Thin film BAW resonators include a membrane on which the layer sequence consisting of the lower electrode, the piezoelectric layer, and the upper electrode is arranged. The acoustic resonator develops by the reflection at the upper side and at the lower side of the membrane. In the alternative concept of solidly mounted resonators, an SMR includes a substrate, for example a silicon substrate, on which the layer sequence consisting of the lower electrode, the piezoelectric layer, and the upper electrode is arranged. So as to keep the acoustic waves in the active region in this design, a so-called acoustic mirror is required. It is located between the active layers, i.e. the two electrodes and the piezoelectric layer, and the substrate. The acoustic mirror consists of an alternating sequence of layers with high and low acoustic impedance, respectively, e.g. layers of tungsten (high acoustic impedance) and layers of oxide material (low acoustic impedance).

If the mirror contains layers of conducting materials, such as tungsten, it is recommended, for the avoidance of parasitic capacitances in the filter, to structure (pattern) and substantially limit the corresponding mirror layers to the area below the active resonator region. The disadvantage of this procedure is that the topology resulting hereby can no longer be completely planarized. Due to the unevenness, undesired modes are induced in the resonator and/or a reduction in the quality of the resonator is caused. This problem is very critical in so far as already small steps or remaining topologies of several percent of the layer thickness have significant influence on the operation behavior of such a resonator.

On the basis of FIGS. 1 and 2, two known methods of manufacturing acoustic mirrors for piezoelectric resonators or BAW resonators are explained in greater detail.

FIG. 1 shows a solidly mounted resonator with structured mirror. The resonator includes a substrate 100 with a lower surface 102 and an upper surface 104. A layer sequence 106 forming the acoustic mirror is arranged on the upper surface. Between the substrate and the mirror, one or more intermediate layers serving for stress reduction or adhesion improvement may be arranged, for example. The layer sequence includes alternately arranged layers 106a with high acoustic impedance and layers 106b with low acoustic impedance, wherein intermediate layers may be provided between the mirror layers. On the upper surface 104 of the substrate 100, a first layer $106b_1$ with low acoustic impedance is formed. On the layer $106b_1$, a material $106a_1$, $106a_2$ with high acoustic impedance is deposited and structured at the portions associated with the active regions of the resonator. Over this arrangement, a second layer $106b_2$ with low acoustic impedance is deposited, upon which in turn a material $106a_3$, $106a_4$ with high acoustic impedance is deposited and structured section-wise. Upon this layer sequence, again a layer with low acoustic impedance $106b_3$ is deposited. On the resulting mirror structure, a lower electrode 110, on which again the active or piezoelectric layer 112, for example of AlN, is arranged, is at least partially formed. On the piezoelectric layer 112, an insulation layer 114 covering the piezoelectric layer 112 except for the regions 116a and 116b is formed. Two upper electrodes 118a and 118b in contact with the piezoelectric layer in the portions 116a and 116b are formed on the piezoelectric layer. A tuning layer 120a and 120b, via the thickness of which a resonance frequency of the resonators can be adjusted, is at least partially arranged on the upper electrode 118a, 118b. By the portions of the upper electrode 118a and 118b in which it is in connection with the piezoelectric layer 112, and the underlying portions of the lower electrode 110, two BAW resonators 122a and 122b are defined. The mirror structure 106 shown in FIG. 1 includes λ/4 mirror layers 106a, 106b.

In the example of a solidly mounted resonator shown in FIG. 1, as it is produced by Epcos AG, for example, the metallic layers 106a are structured without planarizing the resulting topology. The layers 106b with low acoustic impedance are deposited over the structured layers 106a, as described above. Thereby, the steps shown in FIG. 1, which continue in the deposition of the overlaying layers, develop. This procedure is disadvantageous regarding the resulting strong topology in the layers lying above the mirror 106, in particular, with reduced piezoelectric coupling of the active layer 112 as well as increased excitation of undesired vibrational modes arising.

FIG. 2 shows a further example known in the prior art for solidly mounted resonators with a structured mirror. In FIG. 2, again a substrate 100 is shown, on the upper surface 104 of which an oxide layer 124 is deposited, into which a pit or depression 126 is introduced. Further intermediate layers may be provided between the oxide layer 124 and the substrate 100. In the pit 126, the acoustic mirror is formed, which consists of a layer sequence comprising a first layer $106a_1$ with high acoustic impedance, a layer 106b with low acoustic impedance, and a layer $106a_2$ with high acoustic impedance. On the surface of the resulting structure, an insulation layer 108 is deposited, on which the lower electrode 110 is at least partially formed. The portion of the insulation layer 108 not covered by the lower electrode 110 is covered by a further insulation layer 128. On the insulation layer 128 and on the lower electrode 110, the piezoelectric layer 112 is formed, on the surface of which the upper electrode 118 is in turn partially formed. The portions of the piezoelectric layer 112 not covered by the upper electrode 118, as well as parts of the upper electrode 118 are covered by the passivation layer 114. The overlapping areas of lower electrode 110, piezoelectric layer 112, and upper electrode 118 define the BAW resonator 122.

In the example shown in FIG. 2, the pit 126, in which the mirror layers 106a, 106b are deposited after each other, as described above, is etched into the oxide layer 124 in the area of the resonator 122 to be produced. By one or more CMP (chemical mechanical polishing) processes, the layers outside the mirror pit 126 are removed, as this is described in the U.S. patent application US 2002/154425 A1, for example.

The method described on the basis of FIG. 2 is disadvantageous in that the layers are slightly thinner in the corners of the mirror pit 126, and a slight key topology in the resonator region 122, indicated with the reference numeral 130, develops, which again leads to increased excitation of undesired modes and to reduced resonator quality.

SUMMARY OF THE INVENTION

Starting from this prior art, it is an object of the present invention to provide an improved method of manufacturing an acoustic mirror for a piezoelectric resonator, which enables mirrors with excellent uniformity in the layer deposition, as well as a planar surface of the entire mirror structure.

In accordance with a first aspect, the present invention provides a method of manufacturing an acoustic mirror of alternately arranged layers of high and low acoustic impedance, preferably for an acoustic resonator, wherein the mirror has a layer sequence of at least one layer with high acoustic impedance and at least one layer with low acoustic impedance, with the steps of: (a) producing a first layer of the layer sequence; (b) producing a second layer of the layer sequence on the first layer, such that the second layer partially covers the first layer; (c) applying a planarization layer on the first layer and on the second layer; (d) exposing a portion of the second layer by structuring the planarization layer, wherein the portion of the second layer is associated with an active region of the piezoelectric resonator; and (e) planarizing the structure from step (d) by removing the portions of the planarization layer remaining outside the portion.

In accordance with a second aspect, the present invention provides a method of manufacturing an acoustic mirror of alternately arranged layers of high and low acoustic impedance, preferably for an acoustic resonator, wherein the mirror has an alternating layer sequence of a plurality of layers with high acoustic impedance and a plurality of layers with low acoustic impedance, with the steps of: (a) alternately producing the first layers and the second layers; (b) applying a planarization layer on the structure produced in step (a); (c) exposing a portion of the topmost second layer by structuring the planarization layer, wherein the portion of the topmost second layer is associated with an active region of the piezoelectric resonator; and (d) planarizing the structure from step (c) by removing the portions of the planarization layer remaining outside the portion.

In accordance with a third aspect, the present invention provides a method of manufacturing a piezoelectric resonator, with the steps of: (a) producing an acoustic mirror of alternately arranged layers of high and low acoustic impedance, preferably for an acoustic resonator, wherein the mirror has a layer sequence of at least one layer with high acoustic impedance and at least one layer with low acoustic impedance, with the steps of: (a.1) producing a first layer of the layer sequence; (a.2) producing a second layer of the layer sequence on the first layer, such that the second layer partially covers the first layer; (a.3) applying a planarization layer on the first layer and on the second layer; (a.4) exposing a portion of the second layer by structuring the planarization layer, wherein the portion of the second layer is associated with an active region of the piezoelectric resonator; and (a.5) planarizing the structure from step (a.4) by removing the portions of the planarization layer remaining outside the portion; (b) producing a lower electrode substantially at least partially on the acoustic mirror; (c) producing a piezoelectric layer at least partially on the lower electrode; (d) producing an upper electrode at least partially on the piezoelectric layer, wherein a region in which the upper electrode, the piezoelectric layer, and the lower electrode overlap, defines an active region of the piezoelectric resonator.

In accordance with a fourth aspect, the present invention provides a method of manufacturing a piezoelectric resonator, with the steps of: (a) producing an acoustic mirror of alternately arranged layers of high and low acoustic impedance, preferably for an acoustic resonator, wherein the mirror has an alternating layer sequence of a plurality of layers with high acoustic impedance and a plurality of layers with low acoustic impedance, with the steps of: (a.1) alternately producing the first layers and the second layers; (a.2) applying a planarization layer on the structure produced in step (a.1); (a.3) exposing a portion of the topmost second layer by structuring the planarization layer, wherein the portion of the topmost second layer is associated with an active region of the piezoelectric resonator; and (a.4) planarizing the structure from step (a.3) by removing the portions of the planarization layer remaining outside the portion; (b) producing a lower electrode substantially at least partially on the acoustic mirror; (c) producing a piezoelectric layer at least partially on the lower electrode; (d) producing an upper electrode at least partially on the piezoelectric layer, wherein a region in which the upper electrode, the piezoelectric layer, and the lower electrode overlap, defines an active region of the piezoelectric resonator.

The inventive method enables the manufacture of a highly planar acoustic mirror and produces a mirror ensuring both excellent uniformity in the layer deposition and a planar surface of the entire mirror structure. Thus, according to the invention, optimum deposition of the layers lying above the mirror is enabled, which particularly results in high coupling of the piezoelectric layer. Furthermore, according to the invention, also a very homogenous layer distribution in the mirror is achieved, which again leads go high quality of the resonator and to minimum excitation of undesired vibrational modes.

According to the invention, the acoustic mirror is manufactured by a novel combination of depositing, structuring (patterning), and planarizing steps. According to the invention, for this, one or more layers of the mirror are structured, then a planarization layer is deposited on the whole area and opened by an etching process in the resonator region. The resonator region is that region of the mirror associated with the active region of the piezoelectric resonator, wherein the region to be opened is usually selected greater than the active resonator region actually resulting later, due to the adjustment tolerances and due to not exactly perpendicular etching flanks. Then, according to the invention, only the ridges remaining in the overlapping region are removed by a planarization process, for example by a CMP method, wherein the above-described steps are repeated several times depending on the number of the layers to be realized in the acoustic mirror, according to a preferred embodiment of the present invention.

According to the invention, for opening the planarization layer in the critical region, an etching process is thus used, which is selective with reference to the material of the topmost layer of the mirror structure, i.e. this topmost layer serving as etch stop layer. According to the invention, it is thus taken advantage of the fact that such etching processes largely conserve the topology developed in the deposition, whereby the inventive, highly planar, acoustic mirror structure is securely achieved in the critical region of a BAW resonator or piezoelectric resonator.

The highly planar shape of the mirror does not only result from the etching procedure. As mentioned above, a non-planar topology results already in the deposition in the method according to FIG. 2, because the deposition rate in the corners of the mirror pitch is different than at the center. Moreover, a slight key topology is produced at the center when mechanically polishing. It is the substantial point of the present invention that all depositions take place on planar foundation (and thus no topology develops in the deposition), wherein the planarization steps are chosen so that they do not produce substantial topology in the layers in the resonator region.

Preferably, the second layer to be structured is a conductive layer. The layers for the mirror described in connection with the present invention may be divided into either conductive/non-conductive or non-insulating/insulating layers, or into layers with low or high acoustic impedance. Due to parasitic electrical couplings, when using conductive layers, these are structured independently of whether they have the higher or the lower acoustic impedance. Semiconducting layers may also be used.

According to a first preferred embodiment of the present invention, the layer with high acoustic impedance is a conductive layer, and a structuring step and planarization step of its own is performed for each conductive layer of the mirror structure. In case of a mirror with two conductive layers, at first all layers up to the first conductive layer are deposited. Then, this is structured and planarized, and then all layers up to the second conductive layer are deposited and again structured and planarized (FIG. 3).

In a second embodiment of the present invention, at first all layers of the mirror are deposited and the conductive layers structured and planarized together with non-conductive layers lying therebetween. As opposed to the first preferred embodiment, here the advantage is that only two lithography steps are required, independent of the number of conductive layers. The first embodiment, however, requires two lithography steps each for every conductive layer to be structured and planarized. But the etching process is more intensive, and the planarization is more difficult due to the higher step.

In addition, an etch stop layer may be deposited below the conductive layers, so that the homogeneity/reproducibility of the etch stop may be improved with a selective etching process.

Preferably, the etching processes are performed using a resist mask or using a hard mask, wherein in the second embodiment the use of a hard mask may be necessary due to the longer etching time.

In the above-described embodiment, the plurality of layers may be performed either in an etching process within one chamber or by several successive etching processes in various chambers.

In the above-described first embodiment, in which every conducting layer is structured and planarized separately, the same or different masks may be used to produce substantially equally or differently large layers with this. In the latter case, a mirror structure of truncated cone shape or truncated pyramid shape may be produced, for example.

According to a further embodiment, the present invention provides a method of manufacturing a piezoelectric resonator, wherein at first an acoustic mirror according to the present invention is produced, and then a lower electrode is produced on the acoustic mirror. A piezoelectric layer, on the upper surface of which an upper electrode is at least partially produced, is at least partially produced on the lower electrode. The region in which the upper electrode, the piezoelectric layer, and the lower electrode overlap, defines the active region of the piezoelectric resonator. Furthermore, it may be provided that, prior to producing the lower electrode, one or more layers with suitable acoustic impedance are applied on the produced acoustic mirror, wherein the lower electrode is produced on these layers. In particular, these layers serve for insulation, when the topmost layer in the mirror structure is a conductive layer, or for adjusting certain acoustic properties, such as the dispersion properties of the layer stack, the resonance frequencies of further modes (shear wave modes), or the temperature course. One layer or a plurality of layers of different materials and with different layer thicknesses may be provided.

Furthermore, the present invention provides a method of manufacturing coupled acoustic resonators. Such resonators are arranged vertically on top of each other, i.e. the active part of the resonator (lower electrode, piezoelectric layer, upper electrode) is present twice, separated by one or more intermediate layers, via which the strength of the acoustic coupling may be adjusted. The entire layer stack is placed on the acoustic mirror, like with the individual resonators.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
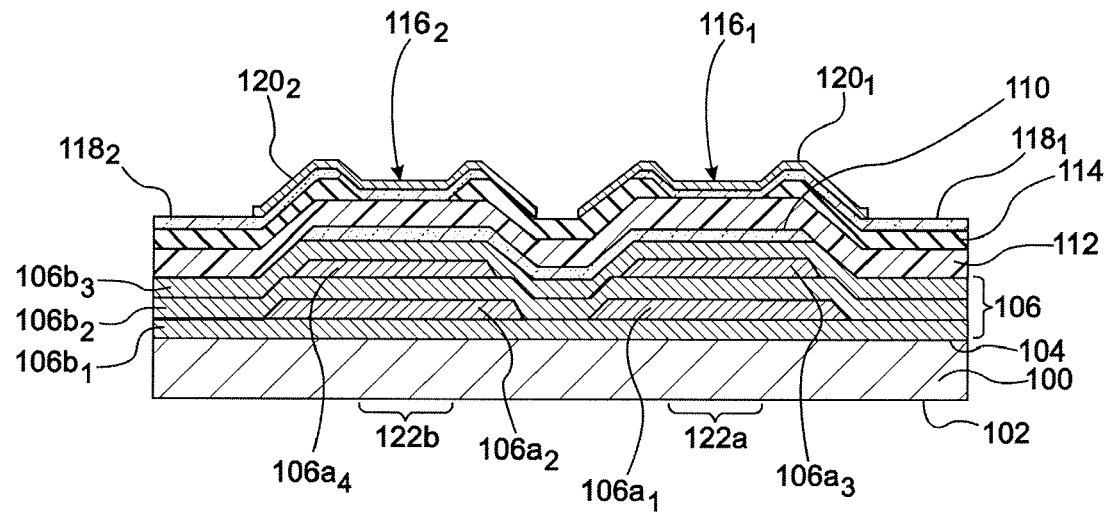
FIG. 1 shows a first example of a solidly mounted resonator with structured mirror according to the prior art.

In the subsequent description of the preferred embodiments of the present invention, the same or similarly acting elements are provided with the same reference numerals.

In the subsequent explanations, it is assumed that the layer to be structured has the higher acoustic impedance. The present invention is not limited to this embodiment, the inventive method rather works in fully analog manner when the conductive layer has the smaller acoustic impedance.

Figure 3A:
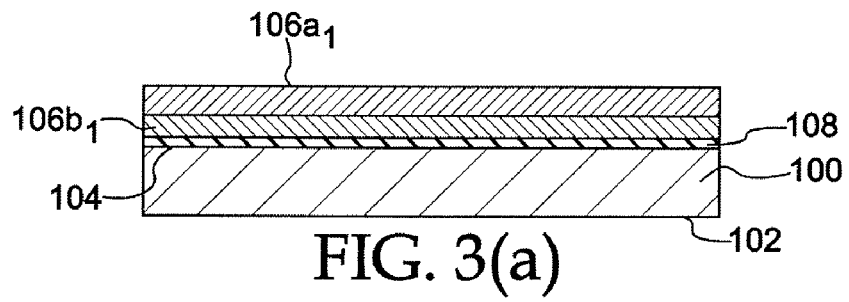
FIGS. 3(a) to (g) show the steps for manufacturing a highly planar acoustic mirror according to the present invention.

On the basis of FIG. 3, the concept underlying the present invention will be explained in greater detail. In FIG. 3(a), a substrate 100 is shown, on the upper surface 104 of which a first layer $106b_1$ with low acoustic impedance, e.g. an oxide, is arranged, on which in turn a first layer $106a_1$ with high acoustic impedance, e.g. a tungsten layer or another suitable conductive layer, has been deposited on the whole area. In addition, as it has been described above, one or more intermediate layers may be provided between the substrate and the mirror or between the mirror layers. Using a hard mask or a resist mask, the structure shown in FIG. 3(a) is subjected to a structuring process by which the first conductive layer $106a_1$ with high acoustic impedance is structured to the shape shown in FIG. 3(b).

Figure 3B:
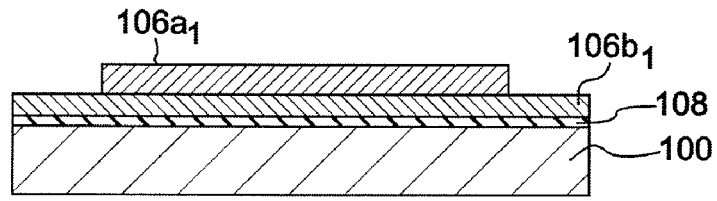
Figure 3C:
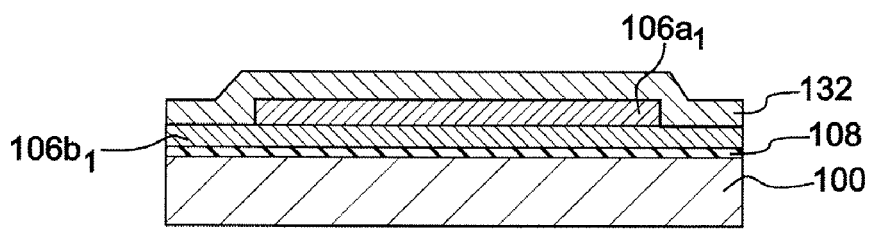

On the structure shown in FIG. 3(b), then a planarization layer 132 is deposited on the whole area, as this is shown in FIG. 3(c). The planarization layer 132 is structured using a suitable mask, for example a resist mask or a hard mask, so as to define the portions of the planarization layer 132 to be removed in a subsequent etching process.

Figure 3D:
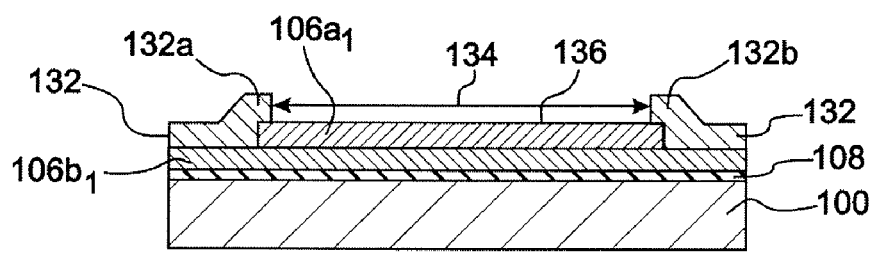

The structure shown in FIG. 3(c) after the masking and after the etching process is shown in FIG. 3(d). The planarization layer 132 is removed in the region 134, such that a surface 136 of the first layer $106a_1$ with high acoustic impedance is exposed, and the ridges 132a, 132b of the planarization layer 132 only remain in the peripheral region. The portion 134 includes at least the active region of the piezoelectric resonator with which the mirror to be produced is used, wherein the region 134 is usually chosen slightly greater than the active region of the piezoelectric resonator actually resulting later, due to the adjustment tolerances and the oblique etching flanks.

Figure 3E:
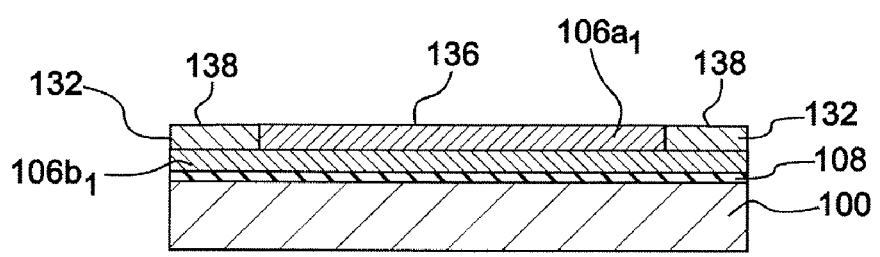

The structure shown in FIG. 3(d) is subjected to a planarization process leading to the removal of the ridges 132a and 132b, for example by a CMP process. The structure resulting after the planarization is shown in FIG. 3(e), in which the structure comprises a planar surface, wherein the surface 136 of the first layer $106a_1$ is substantially flush with a surface 138 of the portions of the planarization layer 132 arranged on the first layer $106b_1$ with low acoustic impedance.

Subsequently, the steps illustrated on the basis of FIGS. 3(a) to 3(e) are repeated, so that the structure shown in FIG. 3(f) with two layers with high acoustic impedance $106a_1$ and $106a_2$, as well as with two layers with low acoustic impedance $106b_1$ and $106b_2$ results.

Figure 2:
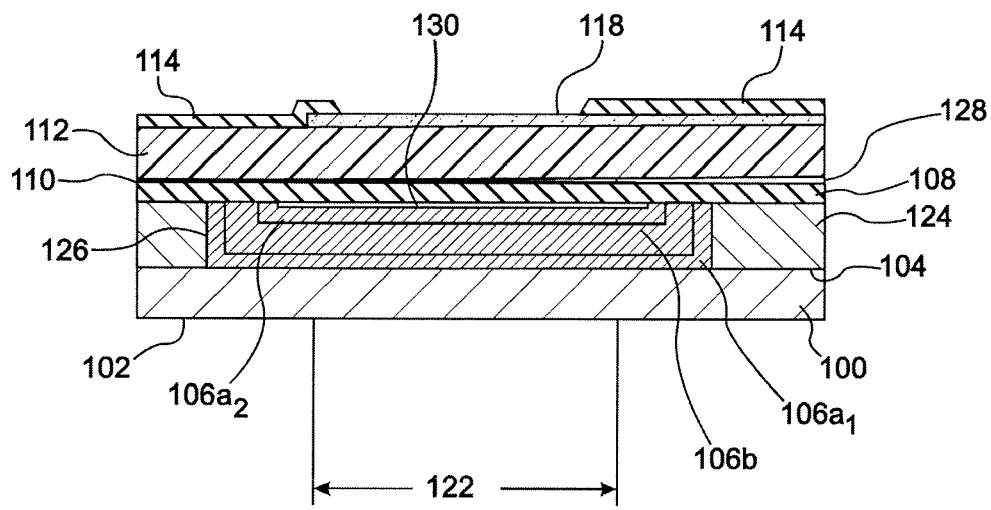
FIG. 2 shows a second example of a solidly mounted resonator with structured mirror according to the prior art.
Figure 3F:
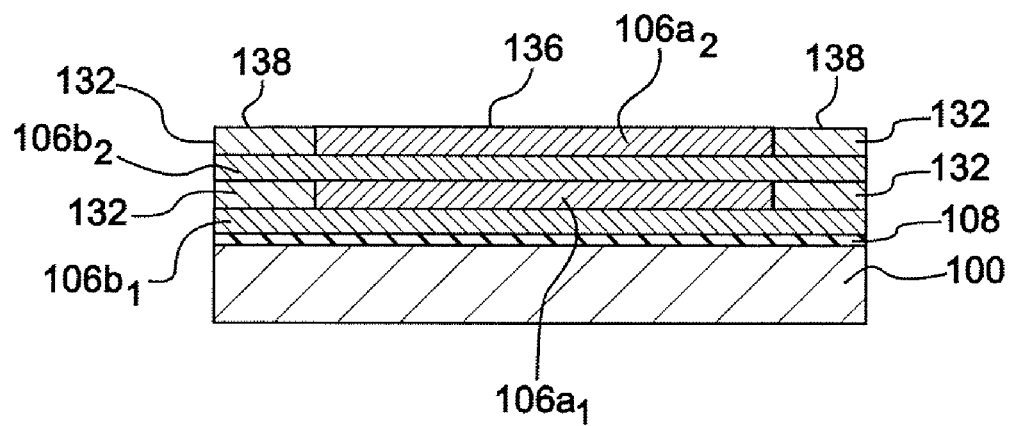
Figure 3G:
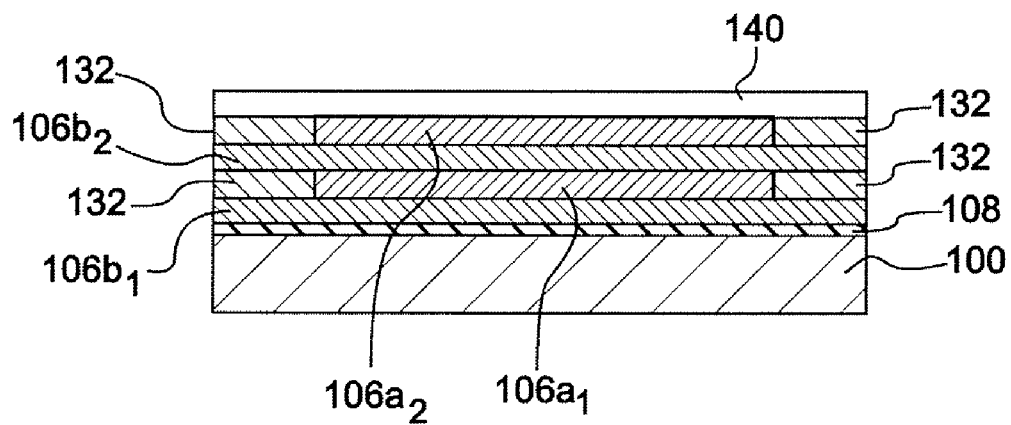

On the structure shown in FIG. 3(f), one or more layers 140 for insulation, when the topmost layer in the mirror structure is a conductive layer, or for adjusting certain acoustic properties are deposited, as this is shown in FIG. 3(g). The lower electrode, the piezoelectric layer, as well as the upper electrode may be deposited on this structure, for example, in the manner described on the basis of FIG. 2 for producing a BAW resonator. Furthermore, an intermediate layer may be applied on the resonator, on which a further resonator structure is produced, to produce two coupled resonators.

On the basis of FIG. 4, a first preferred embodiment of the present invention will be explained in greater detail, namely the inventive processing of an acoustic mirror with two conductive layers by multiple depositing, structuring, and planarizing steps.

Figure 4A:
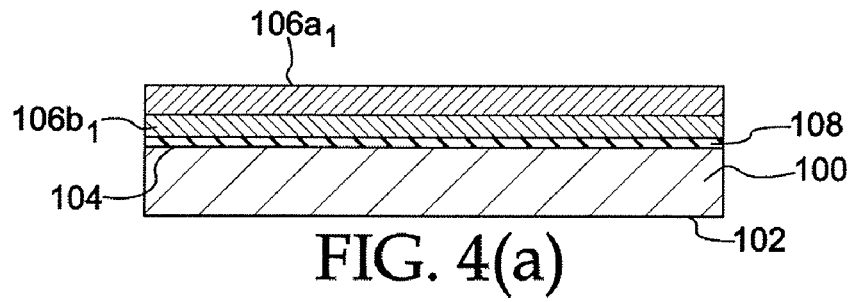
FIGS. 4(a) to (j) show the inventive processing of an acoustic mirror with two conductive layers by multiple depositing, structuring, and planarizing steps according to a first preferred embodiment.
Figure 4B:
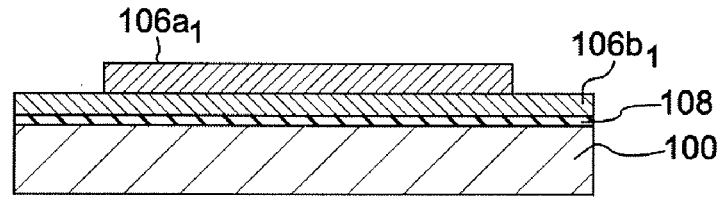
Figure 4C:
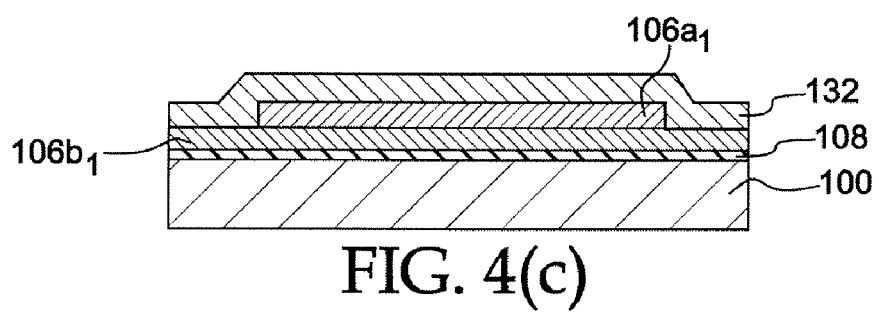
Figure 4D:
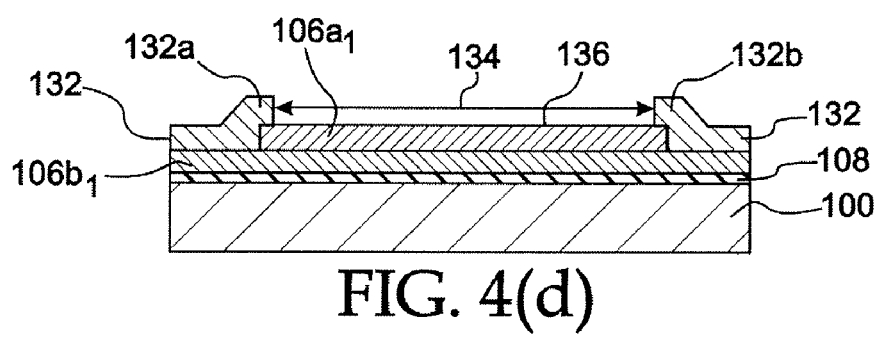
Figure 4E:
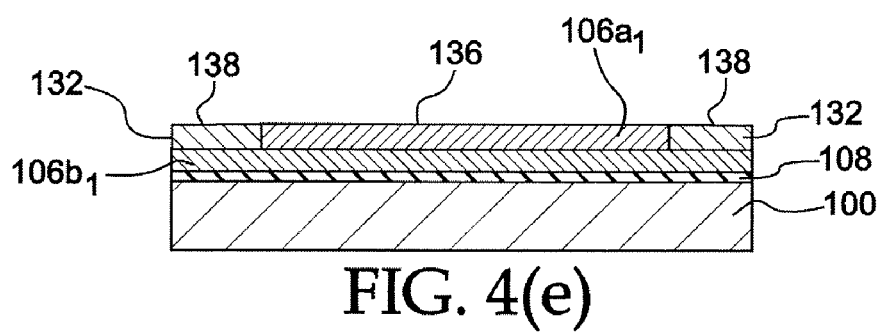
Figure 4F:
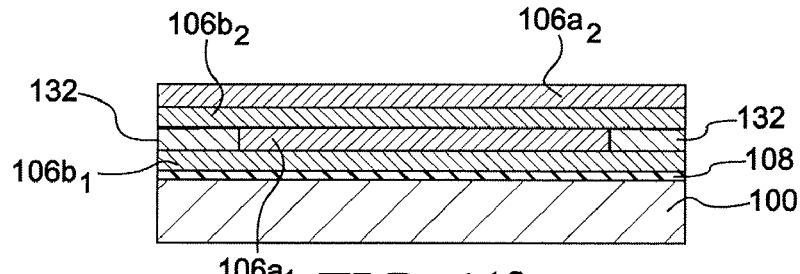
Figure 4G:
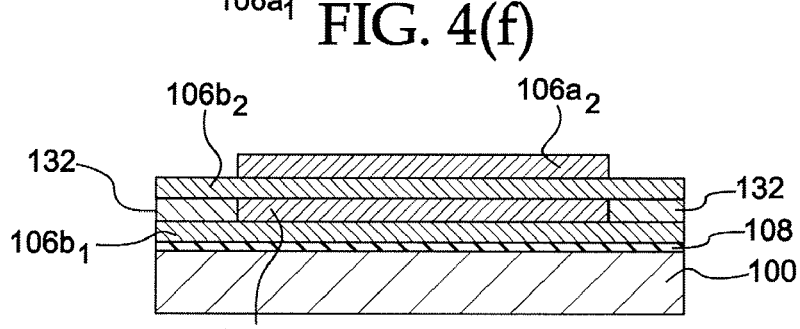
Figure 4H:
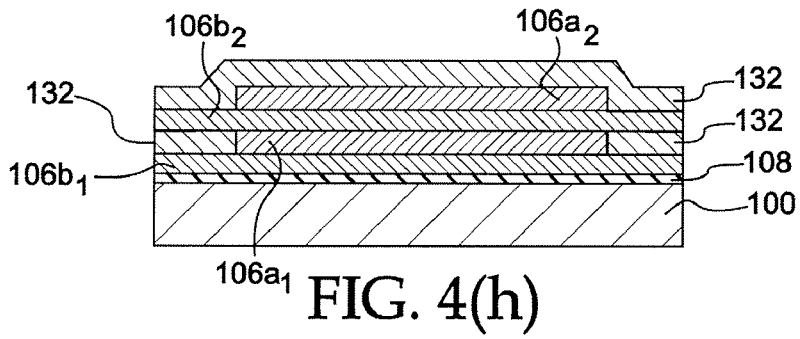

The procedural steps shown in FIGS. 4(a) to 4(e) correspond to the procedural steps described on the basis of FIGS. 3(a) to (e), so that renewed description thereof is omitted. A second layer $106a_2$ with high acoustic impedance, for example again a tungsten layer or another suitable metal layer, is then deposited on the structure shown in FIG. 4(e) on the whole area, as this is shown in FIG. 4(f). Using the above-described processes, the layer $106a_2$ is then structured, so that the structure shown in FIG. 4(g) results. A further planarization layer 132 is then deposited on this structure, as this is shown in FIG. 4(h). This is again structured, and the portion 134 is opened by means of an etching step, to expose the surface 136 of the layer $106a_2$.

Figure 4I:
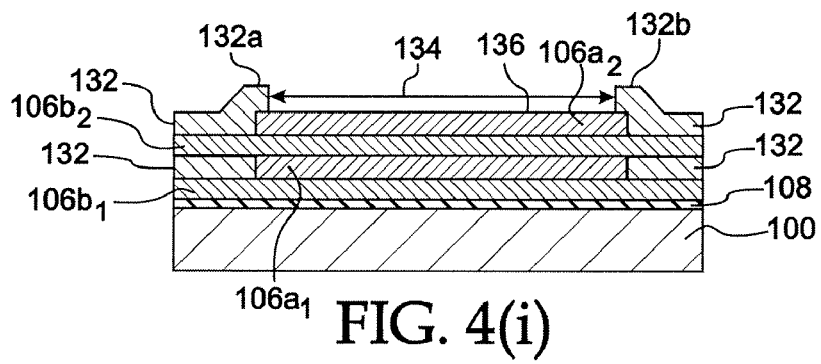

Again, the ridges 132a and 132b remain, as this is shown in FIG. 4(i). After the planarization of the structure shown in FIG. 4(i), the structure shown in FIG. 4(j) with the planar surface results, i.e. a structure in which the surfaces 136 and 138 are substantially flush.

On the basis of FIG. 5, a second preferred embodiment of the present invention will be explained in greater detail in the following, namely the processing of an acoustic mirror with two conductive layers by common structuring and planarizing of all conductive mirror layers.

Figure 5A:
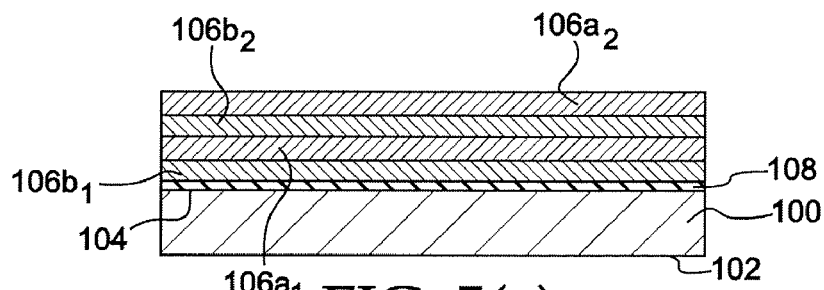
FIGS. 5(a) to (e) show the inventive processing of an acoustic mirror with two conductive layers by common structuring and planarization of all mirror layers according to a second preferred embodiment of the present invention.

In FIG. 5(a), the substrate 100, on the upper surface 104 of which the insulation layer 108 is arranged, is shown. In contrast to the previously described embodiments, the layer sequence consisting of a first layer $106b_1$ with low acoustic impedance, a first layer $106a_1$ with high acoustic impedance, a further layer $106_2$ with low acoustic impedance, and a further layer $106a_2$ with high acoustic impedance is produced on the surface 104 of the substrate 100 according to the second embodiment of the present invention, as this is shown in FIG. 5(a).

Figure 5B:
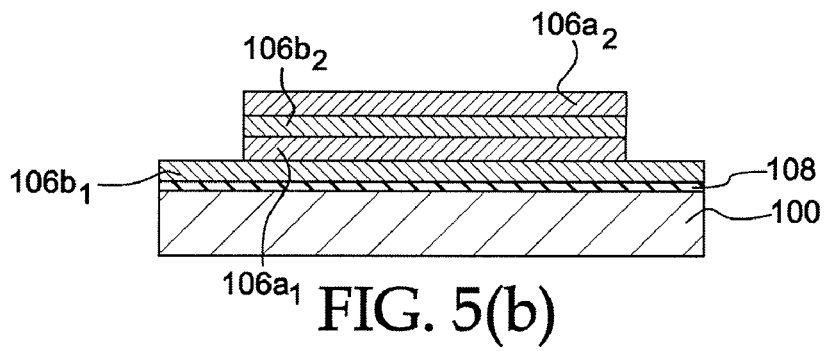
Figure 5C:
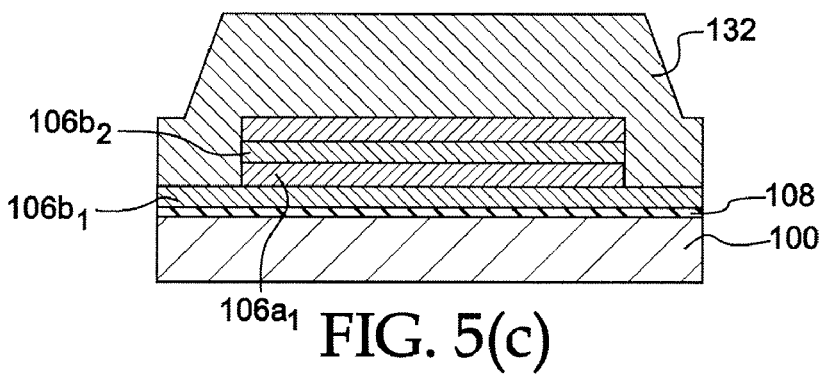
Figure 5D:
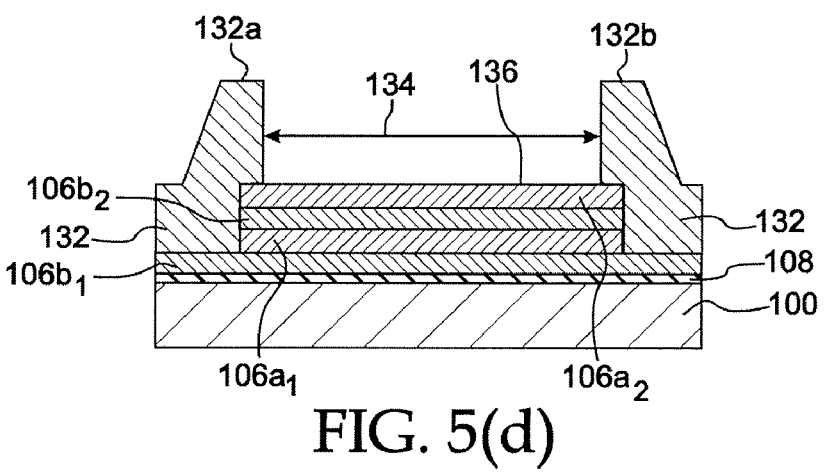

The structure shown in FIG. 5(a) is then subjected to a structuring process, wherein the lowest layer $106b_1$ is not structured. By customary masking and etching steps, the layer sequence of the layers $106a_1$, $106b_2$, $106a_2$ is given the desired structure, as it is shown in FIG. 5(b). The planarization layer 132 is deposited over this structure, so that the structure shown in FIG. 5(c) results. Similar to the preceding embodiments, structuring of the layer 132 now takes place such that an upper surface of the second layer $106a_2$ with high acoustic impedance is exposed, and only the ridges 132a and 132b remain, as this is shown in FIG. 5(d). A subsequent planarization step removes the ridges 132a and 132b, so that the structure shown in FIG. 5(e) results.

Figure 4J:
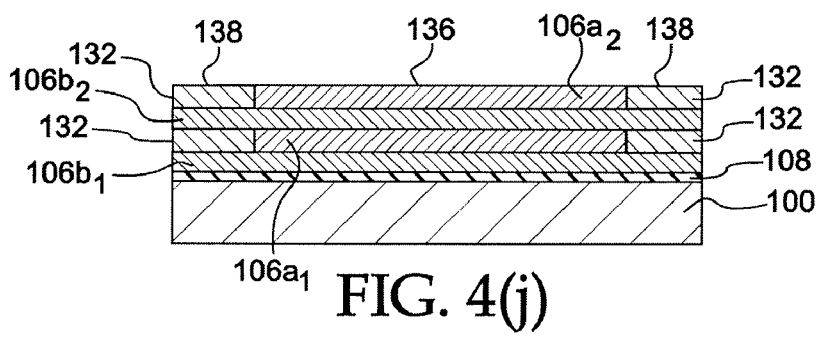
Figure 5E:
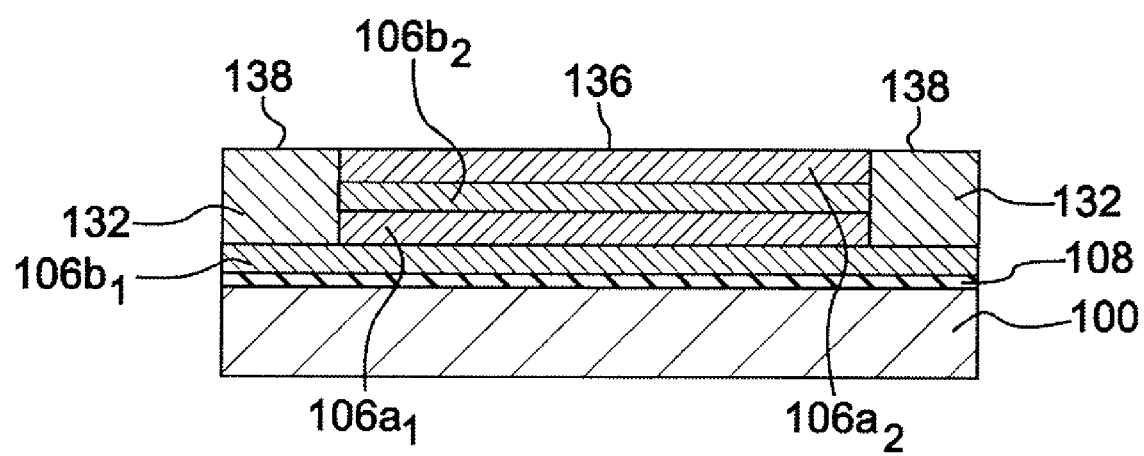

A lower electrode, a piezoelectric layer, as well as an upper electrode may be applied on the structure shown in FIG. 5(e), just like on the structure shown in FIG. 4(j), in order to complete processing the piezoelectric resonator device, as this has already been explained above on the basis of FIG. 3.

Although the above-described acoustic mirrors according to the preferred embodiments of the present invention comprise a layer with high acoustic impedance, for example a metal layer, as the topmost layer, the present invention is not limited to such a mirror structure. Rather, by means of the inventive method, also a mirror structure the topmost surface of which is a layer with low acoustic impedance may be produced. Furthermore, tungsten layers were mentioned above as layer with high acoustic impedance, and oxide layers were mentioned as layer with low acoustic impedance.

The present invention is not limited to these materials, but other materials having high acoustic impedance or low acoustic impedance, conductive or non-conductive materials, may be equally employed.

As has been described above, the structured mirror layers may be of variable size, so that a structure of truncated cone of truncated pyramid shape results. In principle, the layout of the resonator/mirror may, however, also have any shape (e.g. a trapezoid), whereby an interesting shape results for the three-dimensional mirror. In principle, it is even of advantage when the resonators are not round or rectangular, because regular shapes have many additional (mostly unwanted) vibrational modes of similar resonance frequency.

In connection with the subject of the present invention, however, it is to be noted that the shape of the resonator/mirror is insignificant. The structured layers may thus all be equally large or not (i.e. cuboids or truncated pyramid or the like).

Furthermore, the present invention is independent of the thickness of the layers in the mirror. The acoustic mirror usually is no λ/4 mirror, since there are various modes and wave types (longitudinal/shear waves). For this reason, it is mostly favorable to make the layer construction not periodic, i.e. each layer has different thickness.

The above description of the preferred embodiments substantially refers to the acoustically or electrically relevant layers in the mirror. In addition to these layers, however, also further layers or intermediate layers may be provided. For example, in the mirror structure and in the resonator structure arranged thereupon, one or more structured or unstructured intermediate layers serving as etch stop layers and/or adhesion-promoting layers may be provided. Furthermore, such intermediate layers may serve for further influencing the acoustic properties of the mirror, the resonator structure, or the overall structure. Furthermore, on the resonator structure or the overall structure, one or more structured or unstructured layers for protection and/or for further influencing the acoustic properties of the overall structure may be applied, for example tuning layers and/or passivation layers.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCE NUMERAL LIST

| | |
|---|---|
| 100 | substrate, |
| 102 | lower surface of the substrate, |
| 104 | upper surface of the substrate, |
| 106 | layer sequence of the mirror, |
| 106a | layer with high acoustic impedance, |
| $106a_1, 106a_2$ | layer with high acoustic impedance, |
| 106b | layer with low acoustic impedance, |
| $106b_1, 106b_2$ | layer with low acoustic impedance, |
| 108 | insulation layer, |
| 110 | lower electrode, |
| 112 | piezoelectric layer, |
| 114 | insulation layer, |
| 116a, 116b | open regions in the insulation layer 114, |
| 118 | upper electrode, |
| 118a, 118b | upper electrode, |
| 120a, 120b | tuning layer, |
| 122 | BAW resonator, |
| 122a, 122b | BAW resonator, |
| 124 | oxide layer, |
| 126 | depression, |
| 128 | insulation layer, |
| 130 | key topology, |
| 132 | planarization layer, |
| 132a, 132b | ridges of the planarization layer, |
| 134 | opened region of the planarization layer, |
| 136 | surface of the first $106a_1$, |
| 138 | surface of the planarization layer, |
| 140 | layer |

The invention claimed is:

1. A method of manufacturing an acoustic mirror of alternately arranged layers of high and low acoustic impedance, wherein the mirror comprises an alternating layer sequence of a plurality of layers with high acoustic impedance and a plurality of layers with low acoustic impedance, the method comprising:
   (a) alternately producing the first layers and the second layers;
   (b) applying a planarization layer on the structure produced in (a);
   (c) exposing a portion of a topmost second layer, wherein the portion of the topmost second layer is associated with an active region of a piezoelectric resonator; and
   (d) planarizing the structure from (c) by removing at least part of the planarization layer remaining outside the portion.

2. The method of claim 1, wherein the topmost second layer is a conductive layer.

3. The method of claim 1, wherein the exposing further comprises structuring the planarization layer using a mask.

4. The method of claim 3, wherein the mask comprises a resist mask or a hard mask.

5. The method of claim 1, further comprising applying an etch stop layer between the first layer and an initial second layer.

6. The method of claim 1, wherein the first layer comprises a non-conductive layer, and wherein the second layer comprises a conductive layer.

7. The method of claim 1, wherein the first layer comprises an oxide layer, and wherein the second layer comprises a tungsten layer.

8. The method of claim 1, wherein the planarizing further comprises planarizing the structure such that a surface of the second layer and a surface of the planarization layer applied on the first layer are substantially flush.

\* \* \* \* \*